(12) United States Patent
Kitada et al.

(10) Patent No.: US 7,964,800 B2
(45) Date of Patent: Jun. 21, 2011

(54) PRINTED WIRING BOARD, METHOD FOR FORMING THE PRINTED WIRING BOARD, AND BOARD INTERCONNECTION STRUCTURE

(75) Inventors: Tomofumi Kitada, Sakura (JP); Hiroki Maruo, Sakura (JP); Ryo Takami, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 11/752,843

(22) Filed: May 23, 2007

(65) Prior Publication Data
US 2007/0273045 A1 Nov. 29, 2007

(30) Foreign Application Priority Data

May 25, 2006 (JP) ................. P2006-145389
May 25, 2006 (JP) ................. P2006-145390

(51) Int. Cl.
*H05K 1/03* (2006.01)
(52) U.S. Cl. ...................... 174/255; 174/261
(58) Field of Classification Search .......... 174/254, 174/255, 261
See application file for complete search history.

(56) References Cited

U.S. PATENT DOCUMENTS

| | | | | |
|---|---|---|---|---|
| 6,002,172 A * | 12/1999 | Desai et al. | ................. | 257/737 |
| 6,028,357 A | 2/2000 | Moriyama | | |
| 6,218,030 B1 * | 4/2001 | Miyake et al. | ................. | 428/618 |
| 6,335,571 B1 * | 1/2002 | Capote et al. | ................. | 257/787 |
| 6,384,339 B1 * | 5/2002 | Neuman | ................. | 174/254 |
| 6,449,836 B1 * | 9/2002 | Miyake et al. | ................. | 29/830 |
| 6,546,622 B2 | 4/2003 | Iba et al. | | |
| 6,589,870 B1 | 7/2003 | Katoh | | |
| 6,809,415 B2 * | 10/2004 | Tsukada et al. | ................. | 257/693 |
| 2002/0045135 A1 | 4/2002 | Watanabe | | |
| 2006/0244140 A1 | 11/2006 | Hu | | |
| 2008/0138505 A1 | 6/2008 | Takai et al. | | |

FOREIGN PATENT DOCUMENTS

| | | |
|---|---|---|
| JP | 8-23147 A | 1/1996 |
| JP | 08-023147 A | 1/1996 |
| JP | 09-046031 A | 2/1997 |
| JP | 2000-228580 A | 8/2000 |
| JP | 2001-332582 A | 11/2001 |
| JP | 2006-13160 A | 1/2006 |
| TW | I243007 | 11/2005 |

* cited by examiner

*Primary Examiner* — Ishwarbhai B Patel
(74) *Attorney, Agent, or Firm* — Sughrue Mion, PLLC

(57) ABSTRACT

A board interconnection structure having a first printed wiring board in which a first conductive circuit is arranged on a first insulating layer, the first conductive circuit having, on an end portion thereof, a first connection terminal in which an upper surface width is narrower than a bottom surface width; a second printed wiring board in which a second conductive layer having a second connection terminal is arranged on a second insulating layer; and a connection layer that forms fillets along longitudinal side surfaces of the first connection terminal, and interconnects the first connection terminal and the second connection terminal. The first connection terminal may have a projection portion.

9 Claims, 8 Drawing Sheets

PRINTED WIRING BOARD, METHOD FOR FORMING THE PRINTED WIRING BOARD, AND BOARD INTERCONNECTION STRUCTURE

Priority is claimed from Japanese Patent Application No. 2006-145389 and 2006-145390, filed May 25, 2006, the contents of which are incorporated herein by reference.

BACKGROUND

The present invention relates to a technology for interconnecting printed boards. In particular, the present invention relates to a printed wiring board, a method for forming the printed wiring board, and a board interconnection structure, which enhances interconnection strength of the boards.

DESCRIPTION OF THE RELATED ART

As an electronic instrument is being required to be smaller, lighter in weight, and higher in function, it is more necessary to install a plurality of boards three-dimensionally in a small space of the product. For this, a space for connecting electric signals between the boards must be reduced. However, if the function of the electronic instrument becomes higher, types of the electric signals between the boards are also increased, and the above-described connecting space is increased, which lead to inhibit such miniaturization and weight reduction. For interconnection of the boards, it is common to use connector parts. However, it is difficult to miniaturize the connector parts having fitting mechanisms. Moreover, in the connector parts, electric bonding is performed therefor by compressively bonding terminals to each other, and accordingly, the connector parts are inferior in bonding themselves is generated, and accordingly, expense of the connector parts is added to total cost in the case of multi-signal connection.

In this connection, in recent years, in the case of electrically interconnecting printed wiring boards such as a rigid board and a flexible board, and in particular, in the case of electrically interconnecting narrow-pitch wires of these boards, a connection method by solder connection is employed as a method that does not use the connector parts. Specifically, connection terminal portions of a pair of printed wiring boards are mutually soldered. A description will be made below of the connection method by the soldering by using FIGS. 1A and 1B.

Figure 1A:
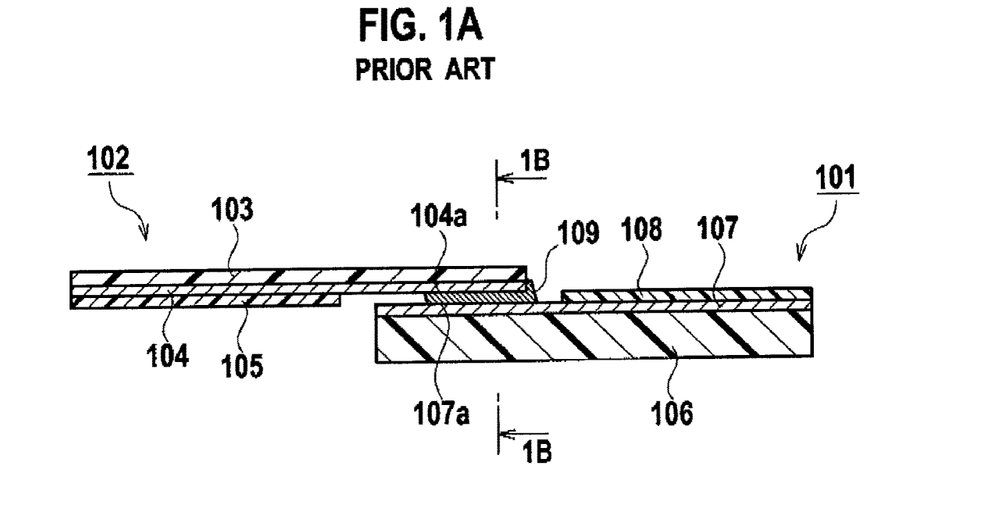
FIG. 1A is a cross-sectional view of connection portions of a conventional board interconnection structure.
Figure 1B:
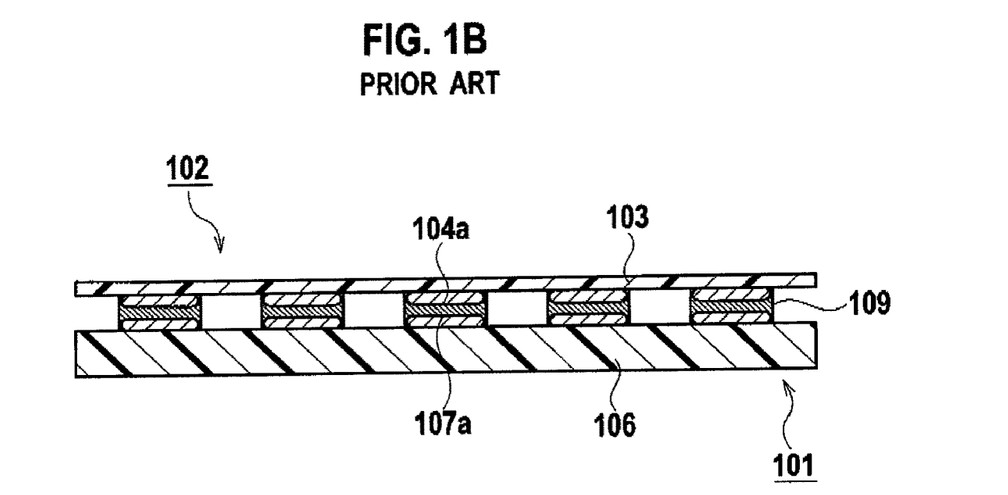
FIG. 1B is a cross-sectional view when the board interconnection structure of FIG. 1A is viewed from a direction of a line 1B-1B of FIG. 1A.

FIG. 1A and FIG. 1B show a structure of a connection portion when a rigid wiring board 101 and a flexible wiring board 102 are interconnected by the solder wiring. FIG. 1A shows a lateral cross section of the connection portion, and FIG. 1B shows a longitudinal cross section (cross section along a line 1B-1B of FIG. 1A) of the connection portion. The flexible wiring board 102 includes a flexible insulating layer 103, a conductive circuit 104 provided on the flexible insulating layer 103, connection terminals 104a as spots of the conductive circuit 104, which are subjected to the solder connection, and a flexible insulating protective layer 105 that protects the conductive circuit 104. The rigid wiring board 101 includes an insulating layer 106, a conductive circuit 107 provided on the insulating layer 106, connection terminals 107a as spots of the conductive circuit 107, which are subjected to the solder connection, and a flexible insulating protective layer 108 that protects the conductive circuit 107.

With regard to a method for supplying a solder 109 between the connection terminals 104a and 107a, solder plating is implemented for surfaces of both of the connection terminals 104a and 107a or for surfaces of either thereof, or alternatively, a cream solder is printed on the surfaces of the connection terminals 107a. After the solder 109 is supplied between the connection terminals 104a and 107a, the connection terminals 104a and 107a are made to face each other, and the rigid wiring board 101 and the flexible wiring board 102 are positionally aligned and stacked on each other. While keeping this state, the entirety of the connection portions are heated up by a heater such as a heater chip until the solder 109 is molten. Then, as shown in FIG. 1B, the connection terminals 104a and 107a are interconnected. As a result, electric conduction between the rigid wiring board 101 and the flexible wiring board 102 is made possible.

Since, however, microfabrication and pitch fining of the conductive circuits of the printed wiring boards are advanced in recent years, problems occur in the connection method as described above. Specifically, in the connection structure shown in FIGS. 1A and 1B, the molten solder 109 squeezes out if the solder 109 is excessively applied between the connection terminals 104a and 107a, when the connection terminals 104a and 107a are interconnected by thermocompression bonding using the solder 109. Therefore, there is an apprehension that the solder that has squeezed out may be brought into contact with the solder on the adjacent terminals, and may form unexpected solder bridges between the connection terminals.

Accordingly, as a proposal against this problem, Japanese Patent Laid-Open Publication No. H8-23147 shows connection terminals on the flexible wiring board, which are formed to be narrower in width than connection terminals on the opposite circuit board. According to this, the connection terminals on the flexible wiring board are arranged within the width of the connection terminals of the circuit board, and solder fillets are formed along a longitudinal direction on the connection terminals of the circuit board. As a result, the solder is prevented from flowing out to regions of the adjacent connection terminals. In the above-described proposal, however, connection strength between the connection terminals and the flexible insulating layer becomes a problem. In the case of comparing connection strength when the connection terminals are bonded to each other by the solder with connection strength between the connection terminals and the flexible insulating layer, the former connection strength is higher than the latter one since metal bonding is formed in the former one. Hence, in the case of considering the connection strength, the connection between the connection terminals and the flexible insulating layer becomes important. In this case, the wider connection terminal is more advantageous. However, since the connection terminals on one side are thinned in the above-described proposal, the connection strength against a stress in a tensile direction or a peeling direction is weakened.

Moreover, the above-described proposal has a harmful effect on the microfabrication of the connection portions. In the printed wiring boards, limitations are imposed on a width of processable conductors and a minimum value of a pitch therebetween. In the above-described proposal, it becomes necessary to widen the width of the connection terminals on at least one side more than the minimum width at which it is possible to process the conductors. This inhibits the micro connection portions from being realized.

In this connection, Japanese Patent Laid-Open Publication No. H9-46031 proposes to form slits on the connection terminals on the flexible wiring board in order to increase the above-described connection strength, that is, tensile strength or peeling strength between the boards. According to this publication, the excessive solder is stored in the slits. Hence, short circuit owing to the excessive solder is prevented, and in addition, the connection strength is enhanced by fillets formed on both sides of the slits.

It is considered to use etching treatment as means for forming the slits on the connection terminals. However, there are limitations on microfabrication of the circuits in terms of the width and the slits (i.e. circuit interval), which can be formed by the etching treatment. For example, when one slit is formed on the center of each connection terminal 104*a* shown in FIG. 1B, and each connection terminal 104*a* is divided into two, it is necessary that the circuit width necessary for the connection portions be set equal to or more than a width obtained by adding a width of the formable slits to a width at least double a width of the formable circuits. That is, it is necessary to thicken the circuit width. This inhibits the pitch between the circuits from being made more micro. Moreover, when the slits are formed on the connection terminals on the conductive circuits on one side, an area where the connection terminals are pasted on the insulating layer is reduced. Therefore, when a stress that peels the flexible wiring board from the rigid wiring board is applied thereto, the peeling becomes prone to occur on interfaces between the connection terminals and the insulating layer, resulting in reduction of the connection strength as a whole.

SUMMARY OF EXEMPLARY EMBODIMENTS OF THE INVENTION

It is an aspect of the present invention to provide a printed wiring board, a method for forming the printed wiring board, and a board interconnection structure, which can prevent the decrease of the peeling strength between the connection terminals and the insulating layer and prevent the short circuit by storing the excessive solder without inhibiting the pitch between the circuits from being made more micro, thereby enhance the connection strength between the connection terminals.

A first aspect of the present invention is a printed wiring board, including: an insulating layer; and a conductive circuit arranged on the insulating layer, the conductive circuit having, on an end portion thereof, a connection terminal in which an upper surface width is narrower than a bottom surface width.

Here, the connection terminal may be formed by providing thereon a projection portion in a direction where the conductive circuit is extended.

A second aspect of the present invention is a board interconnection structure, including: a first printed wiring board in which a first conductive circuit is arranged on a first insulating layer, the first conductive circuit having, on an end portion thereof, a first connection terminal in which an upper surface width is narrower than a bottom surface width; a second printed wiring board in which a second conductive circuit having a second connection terminal is arranged on a second insulating layer; and a connection layer that forms fillets along longitudinal side surfaces of the first connection terminal, and interconnects the first connection terminal and the second connection terminal.

Here, in the above-described interconnection structure, a projection portion may be provided on the first connection terminal of the first conductive circuit in a direction where the first conductive circuit is extended.

A third aspect of the present invention is a method for forming a printed wiring board, including: preparing an insulating layer, on a surface of which a conductive circuit having a connection terminal is arranged; coating resist on the insulating layer and the conductive circuit; patterning the resist into a desired pattern; by using the patterned resist, forming a projection portion on the conductive circuit in a direction where the conductive circuit is extended; and removing the patterned resist.

According to the present invention, the decrease of the peeling strength between the connection terminals and the insulating layer, and the solder bridges (short circuit) between the connection terminals, owing to excessive solder, can be prevented without inhibiting the pitch between the circuits from being made more micro. Hence, the printed wiring board, the method for forming the printed wiring board, and the board interconnection structure, which enhance the connection strength between the connection terminals, can be provided.

DETAILED DESCRIPTION OF THE EXEMPLARY EMBODIMENTS OF THE INVENTION

A description will be made below of non-limiting embodiments of the present invention with reference to the drawings. In the following description, the same or similar portions of the drawings are denoted by the same or similar reference numerals. Note that the drawings are schematic, and that relationships between thicknesses and planar dimensions, ratios of thicknesses of the respective layers, and the like differ from the actual ones. Hence, specific thicknesses and dimensions should be determined by referring to the following description. Moreover, it is a matter of course in the drawings, that portions in which the dimensional relationships and the ratios are mutually different are included.

First Non-Limiting Embodiment

Printed Wiring Board

Figure 2:
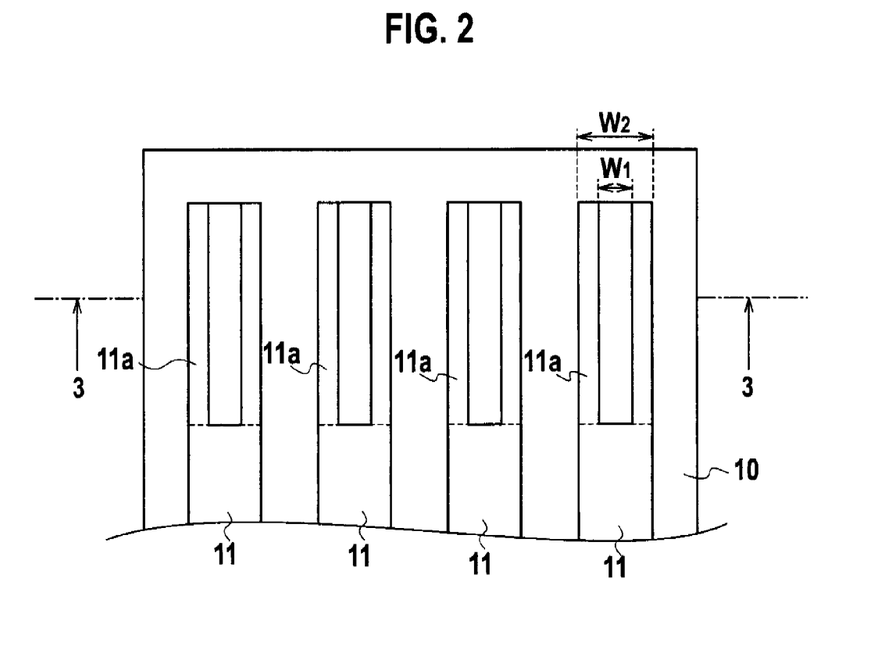
FIG. 2 is a plan view of a printed wiring board according to a first non-limiting embodiment of the present invention.
Figure 3:
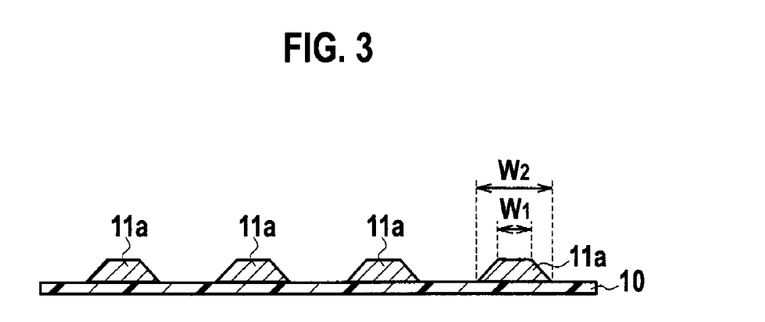
FIG. 3 is a cross-sectional view when the printed wiring board of FIG. 2 is viewed from a direction of a line 3-3 of FIG. 2.

As shown in FIG. 2, a printed wiring board according to a first embodiment of the present invention includes an insulating layer 10, and conductive circuits 11 having, on end portions thereof, connection terminals 11a in each of which a width $W_1$ of an upper surface is narrower than a width $W_2$ of a bottom surface. FIG. 3 is a cross-sectional view of the printed wiring board viewed from a direction of a line 3-3 of FIG. 3.

As the insulating layer 10, for example, a flexible board such as a polyimide board, a polyethylene terephthalate (PET) board, and a polyethylene naphthalate (PEN) board can be used. Alternatively, as the insulating layer 10, for example, a hard rigid board such as a glass epoxy board, a glass composite board, and a paper epoxy board can be used. It is preferable that the insulating layer 10 have heat resistance to a temperature of a melting point of a solder or higher. In the case of using the rigid board as the insulating layer 10, for a thickness thereof, 2.4 mm, 2.0 mm, 1.6 mm. 1.2 mm, 1.0 mm, 0.8 mm, 0.6 mm, 0.4 mm, 0.2 mm, and the like can be employed. Moreover, in the case of using the flexible board as the insulating layer 10, for a thickness thereof, 25 μm, 12.5 μm, 8 μm, 6 μm, and the like can be employed.

The conductive circuits 11 form a circuit pattern of conductors, which are designed on the insulating layer 10. On the insulating layer 10, the conductive circuits 11 are formed of rolled copper foil, electrolytic copper foil, or the like by pattern processing. In the conductive circuits 11, metal foil other than the copper foil is also usable as the conductors. A pitch between the conductors in the conductive circuit 11 is set at 10 to 500 μm, and a width of the conductors is set at 10 to 500 μm. For a thickness of the conductive circuits 11, 35 μm, 18 μm, 12 μm, 9 μm, and the like can be employed. On the conductive circuits 11, coverlay films that use, as a base material, an insulating polyimide film having excellent flexibility even after being adhered, or the like are arranged as cover layers (not shown).

The connection terminals 11a are formed by a subtractive method, thus making it possible to be formed so that the upper surface width $W_1$ can be set smaller than the bottom surface width $W_2$. When the insulating layer 10 is the flexible board, the connection terminals 11a can be arranged so as to be extended to an end portion of the insulating layer 10. Meanwhile, when the insulating layer 10 is the rigid board, it is preferable that the connection terminals 11a be arranged so as to keep a little space from the end portion of the insulating layer 10. The connection terminals 11a are subjected to surface treatment by preflux treatment, hot air leveling (HAL), electrolytic solder plating, electroless solder plating, and the like.

According to the above-described printed wiring board, a connection area between the insulating layer 10 and the connection terminals 11a is not reduced, and accordingly, connection strength between the insulating layer 10 and the connection terminals 11a is not decreased. Moreover, the upper surface width $W_1$ of each connection terminal 11a is narrower than the bottom surface width $W_2$ thereof, thus making it possible to form fillets 23 (shown in FIG. 4) along longitudinal side surfaces of the connection terminals 11a. Accordingly, formation of solder bridges and a connection failure in the connection layers 19 (shown in FIG. 4) can be prevented.

Moreover, according to the above-described printed wiring board, the connection terminals 11a may be formed so as to have the minimum width at which the connection terminals 11a can be processed. Accordingly, micro connection portions can be realized.

Furthermore, the connection terminals 11a can be formed by the subtractive method, and accordingly, when the conductive circuits 11 are processed by the subtractive method, the conductive circuits 11 can be formed without increasing the number of manufacturing steps.

(Board Interconnection Structure)

Figure 4:
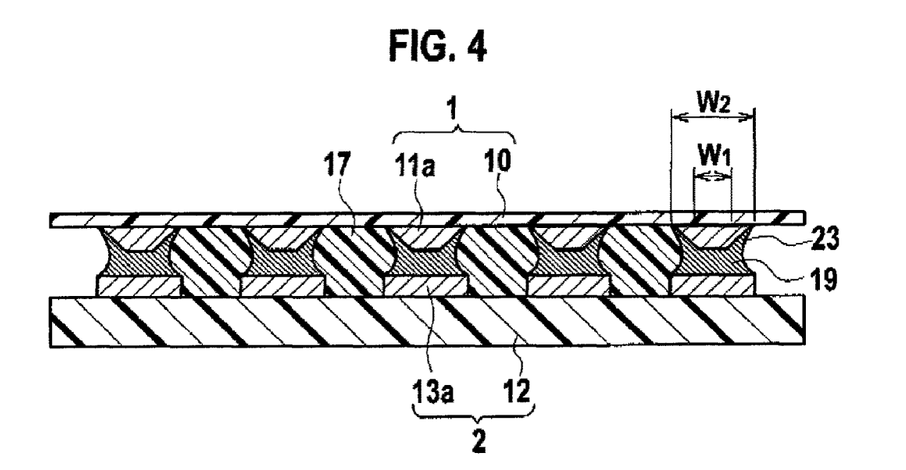
FIG. 4 is a cross-sectional view of a board interconnection structure according to the first non-limiting embodiment.

As shown in FIG. 4, a board interconnection structure according to the first embodiment of the present invention includes: a first printed wiring board 1 in which first conductive circuits are arranged on the first insulating layer 10, the first conductive circuits having, on end portions thereof, the first connection terminals 11a in which the upper surface width $W_1$ is narrower than the bottom surface width $W_2$; a second printed wiring board 2 in which second conductive circuits having second connection terminals 13a are arranged on a second insulating layer 12; and connection layers 19 in which the fillets 23 are formed along the longitudinal side surfaces of the first connection terminals 11a. The connection layers 19 interconnects the first connection terminals 11a and the second connection terminals 13a.

As the second insulating layer 12, for example, the hard rigid board such as the glass epoxy board, the glass composite board, and the paper epoxy board can be used. Moreover, the flexible board can also be used as the second insulating layer 12. It is preferable that the second insulating layer 12 have the heat resistance to the temperature of the melting point of the solder or higher. In the case of using the rigid board, for a thickness thereof, 2.4 mm, 2.0 mm, 1.6 mm. 1.2 mm, 1.0 mm, 0.8 mm, 0.6 mm, 0.4 mm, 0.2 mm, and the like can be employed. Moreover, in the case of using the flexible board, for a thickness thereof, 25 μm, 12.5 μm, 8 μm, 6 μm, and the like can be employed.

The second conductive circuits form a circuit pattern of conductors, which are designed on the second insulating layer 12. The second conductive circuits are formed by performing the pattern processing for the rolled copper foil or the electrolytic copper foil on the second insulating layer 12. For the second conductive circuits, the metal foil other than the copper foil is also usable. A pitch between the conductors in the second conductive circuit is set at 10 to 500 μm, and a width of the conductors is set at 10 to 500 μm. For a thickness of the second conductive circuits, 35 μm, 18 μm, 12 μm, 9 μm, and the like can be employed. On the second conductive circuits, the coverlay films or the like are arranged as cover layers (not shown). In the case of using the rigid board, the coverlay films use solder resist as a base material, and in the case of using the flexible board, the coverlay films use, as the base material, the insulating polyimide film having the excellent flexibility even after being adhered, or the like.

A width of the second connection terminals 13a is set substantially equal to the bottom surface width $W_2$ of the first connection terminals 11a. A thickness of the second connection terminals 13a can be set, for example, at 15 μm. When the second insulating layer 12 is the flexible board, the second connection terminals 13a can be arranged so as to be extended to an end portion of the second insulating layer 12. Meanwhile, when the second insulating layer 12 is the rigid board, it is preferable that the second connection terminals 13a be arranged so as to keep a little space from the end portion of the second insulating layer 12. The second connection terminals 13a are subjected to the surface treatment by the preflux treatment, the hot air leveling (HAL), the electrolytic solder plating, the electroless solder plating, and the like.

A description will be made of a connection method of the board interconnection structure according to the first embodiment.

First, at least either of the first connection terminals 11a and the second connection terminals 13a is applied with a solder paste or subjected to the solder plating, whereby a solder with a thickness of approximately 3 µm is disposed thereon. Then, the first connection terminals 11a and the second connection terminals 13a are arranged so as to face each other. Moreover, these boards are heated up to 200° C. or higher by the heater such as the heater chip, whereby the connection layers 19 are formed therebetween. As a result, the first connection terminals 11a and the second connection terminals 13a are bonded to each other. When the solder is molten to form the connection layers 19, the solder is stored along the longitudinal side surfaces of the first connection terminals 11a, which are gaps between the first connection terminals 11a and the second connection terminals 13a, thereby forming the fillets 23. Epoxy underfill resin 17 or the like is filled into peripheries of the connection layers 19 by using a capillary phenomenon. The underfill resin 17 is filled there, thus making it possible to increase the connection strength of the connection layers 19, and to prevent the solder from flowing into the adjacent connection terminals. By the manufacturing steps described above, the board interconnection structure shown in FIG. 3 is formed. Note that, as a bonding material for use in the connection layers 19, a lead-containing solder paste, a lead-free solder paste, solder plating, tin plating, and the like can be used.

According to the board interconnection structure described above, the connection area between the first insulating layer 10 and the first connection terminals 11a is not reduced, and accordingly, the connection strength between the first insulating layer 10 and the first connection terminals 11a is not decreased. Moreover, the upper surface width $W_1$ of each first connection terminal 11a is narrower than the bottom surface width $W_2$ thereof, thus making it possible to form the fillets along the longitudinal side surfaces of the first connection terminals 11a. Accordingly, the formation of the solder bridges and the connection failure in the connection layers 19 can be prevented.

Moreover, according to the above-described board interconnection structure, both of the first connection terminals 11a and the second connection terminals 13a may be formed so as to have the minimum widths at which both can be processed. Accordingly, the micro connection portions can be realized.

Furthermore, the bottom surface width $W_2$ of the first connection terminals 11a and the width of the second connection terminals 13a are set substantially equal to each other, whereby both of the connection terminals 11a and 13a do not decrease the connection strength between the first insulating layers 10 and the second insulating layer 12.

Second Non-Limiting Embodiment

Figure 5:
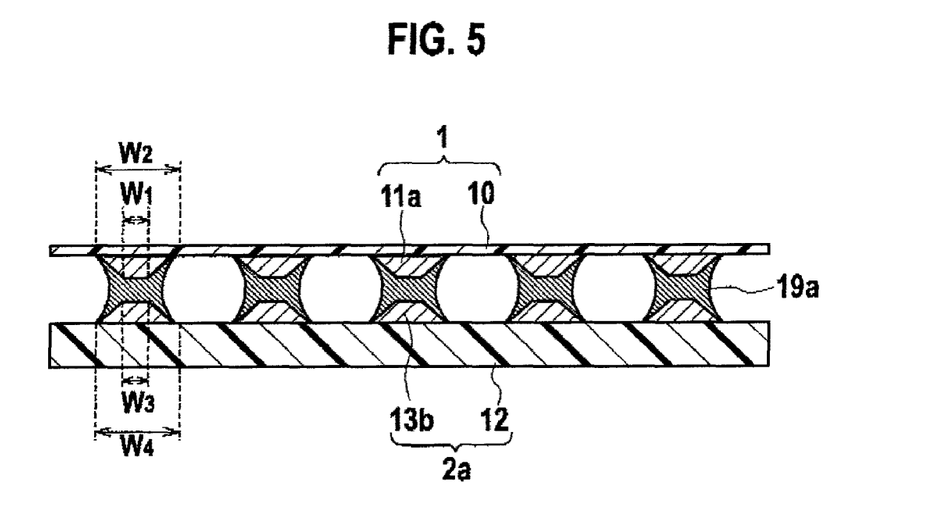
FIG. 5 is a cross-sectional view of a board interconnection structure according to a second non-limiting embodiment.

As shown in FIG. 5, a board interconnection structure according to a second embodiment of the present invention is different from that of FIG. 4, in the case of comparison therebetween, in that an upper surface width $W_3$ of the connection terminals 13b is more narrow than a bottom surface width $W_4$ of the connection terminals 13b of a second printed wiring board 2a. Other elements shown in FIG. 5 are substantially similar to those in the board interconnection structure shown in FIG. 4, and accordingly, a duplicate description will be omitted.

In accordance with the board interconnection structure according to the second embodiment, connection areas between the first insulating layer 10 and the first connection terminals 11a and between the second insulating layer 12 and the second connection terminals 13b are not reduced. Hence, the connection strengths between the first insulating layer 10 and the first connection terminals 11a and between the second insulating layer 12 and the second connection terminals 13b are not decreased. Moreover, the upper surface width $W_1$ of the first connection terminals 11a is narrower than the bottom surface width $W_2$ thereof, thus making it possible to form the fillets along the longitudinal side surfaces of the first connection terminals 11a. Therefore, the formation of the solder bridges and the connection failure in connection layers 19a can be prevented. In a similar way, the upper surface width $W_3$ of the second connection terminals 13b is narrower than the bottom surface width $W_4$ thereof, thus making it possible to form fillets along longitudinal side surfaces of the second connection terminals 13b. Hence, the formation of the solder bridges and the connection failure in the connection layers 19a can be prevented.

Moreover, in accordance with the board interconnection structure according to the second embodiment, both of the first connection terminals 11a and the second connection terminals 13b may be formed so as to have the minimum widths at which both can be processed. Accordingly, the micro connection portions can be realized.

Furthermore, the bottom surface width $W_2$ of the first connection terminals 11a and the bottom surface width $W_4$ of the second connection terminals 13b are set substantially equal to each other, whereby both of the connection terminals 11a and 13b do not decrease the connection strength between the first insulating layers 10 and the second insulating layer 12.

Note that, in the first and second embodiments, each of the cross sections of the first connection terminals 11a and the second connection terminals 13b forms a trapezoidal shape in which side surfaces are linear; however, the side surfaces may be bent in an arc shape. If the side surfaces are bent in the arc shape, whereby surface areas of the side surfaces of the first connection terminals 11a and the second connection terminals 13b are increased, then connection areas of these connection terminals to the solder are increased, thus making it possible to enhance the connection strength therebetween.

Third Non-Limiting Embodiment

Printed Wiring Board

Figure 6:
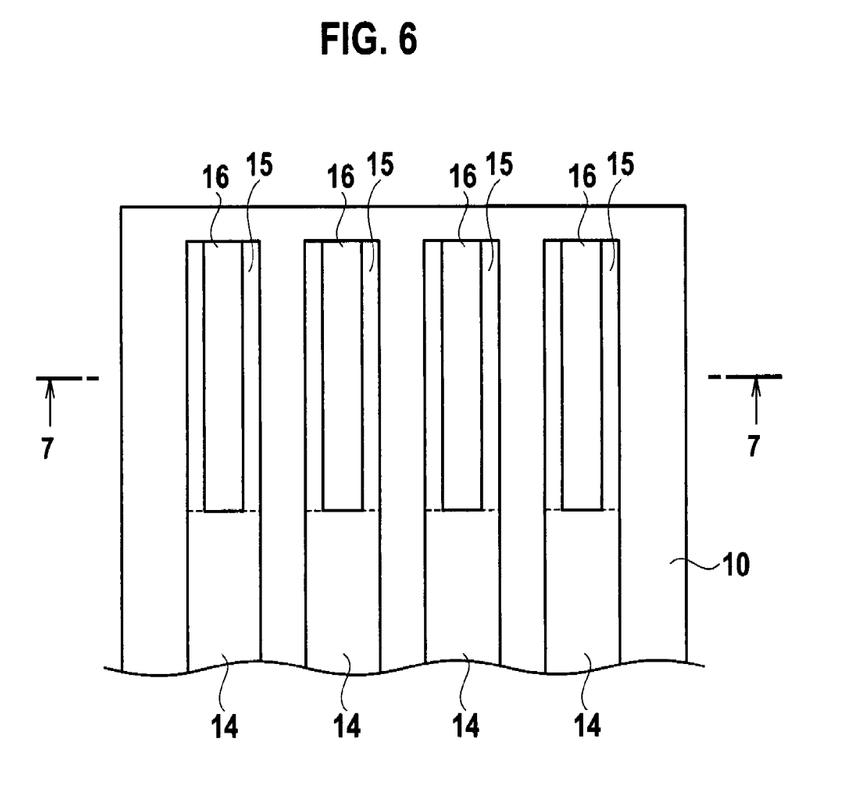
FIG. 6 is a plan view of a printed wiring board according to a third non-limiting embodiment.
Figure 7:
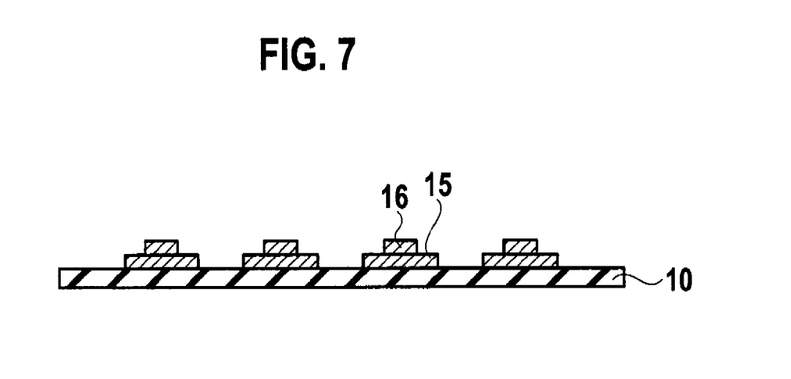
FIG. 7 is a cross-sectional view when the printed wiring board of FIG. 6 is viewed from a direction of a line 7-7 of FIG. 6.

As shown in FIG. 6, a printed wiring board according to a third embodiment of the present invention includes an insulating layer 10, conductive circuits 14 arranged on the insulating layer 10 and having connection terminals 15 on end portions thereof, and projection portions 16 provided on the connection terminals 15 in a direction where the conductive circuits 14 are extended. FIG. 7 is a cross-sectional view of the printed wiring board viewed from a direction of a line 7-7 of FIG. 6.

The insulating layer 10 is similar to that of the first embodiment.

The conductive circuits 14 form a circuit pattern of conductors, which are designed on the insulating layer 10. In the case of the pattern formation using the subtractive method, the conductive circuits 14 are formed by etching the rolled copper foil, the electrolytic copper foil, or the like on the insulating layer 10. Other metal foil than the copper foil is also usable as the conductors. For a thickness of the conductive circuits 14, 35 μm, 18 μm, 12 μm, 9 μm, 5 μm, and the like can be employed. When the conductive circuits 14 are formed by the subtractive method, the minimum pitch between the conductive circuits 14 becomes 35 μm in consideration that a width of the circuits is 15 μm at the minimum, and that a space width between the circuits is 20 μm at the minimum. In the case of a semi-additive method of forming the conductive circuits 14 on the insulating layer 10 by plating, the minimum pitch between the circuits becomes 20 μm in consideration that the width of the circuits is 10 μm at the minimum, and that the space width between the circuits is 10 μm at the minimum. Specifically, the semi-additive method enables the microfabrication more than the subtractive method. On the conductive circuits 14, as the cover layers (not shown), there are arranged the coverlay films or the like, which use, as the base material, the insulating polyimide film having the excellent flexibility after being adhered, or the like.

A thickness of the connection terminals 15 can be set, for example, at 15 μm and 8 μm. When the insulating layer 10 is the flexible board, the connection terminals 15 can be arranged so as to be extended to the end portion of the insulating layer 10. Meanwhile, when the insulating layer 10 is the rigid board, it is preferable that the connection terminals 15 be arranged so as to keep a little space from the end portion of the insulating layer 10.

As shown in FIG. 7, the projection portions 16 are provided on the connection terminals 15. A width of the projection portions 16, that is, a width thereof in a perpendicular direction to the direction where the conductive circuits 14 are extended is set, for example, at 75% of the width of the connection terminals 15. When the width of the connection terminals 15 is 20 μm, the width of the projection portions 16 becomes 15 μm (=20 μm×0.75). With regard to a thickness of the projection portions 16, it is preferable that the sum of the thickness concerned and the thickness of the connection terminals 15 be equivalent to the thickness of the connection terminals of the conventional printed wiring board. For example, the thickness of the projection portions 16 can be set at 10 μm. A material of the projection portions 16 may be the same material as that of the conductive circuits 14, or alternatively, may be a different material from that of the conductive circuits 14 as long as a melting point of the material is higher than the melting point of the solder. As the material of the projection portions, there can be used copper (Cu) plating, nickel (Ni) plating, gold (Au) plating, Ni/Au plating in which the Au plating is further formed on the Ni plating, and the like. For example, a thickness of the Ni/Au plating becomes approximately the sum of the thickness (2 to 8 μm) of the Ni plating and the thickness (0.03 μm) of the Au plating. In the event of selecting the material of the projection portion 16, electric characteristics (conduction resistance, migration characteristics), mechanical strength, and controllability for the shape of the plating become important.

In accordance with the printed wiring board according to the third embodiment, the connection area between the insulating layer 10 and the connection terminals 15 is not reduced. Hence, peeling strength between the insulating layer 10 and the connection terminals 15 is not decreased. Moreover, the projection portions 16 are provided, whereby a surface area of each connection terminal 15 is increased. Therefore, the connection strength can be enhanced.

(Method for Forming Printed Wiring Board)

A description will be made below of a non-limiting method for forming a printed wiring board according to the third non-limiting embodiment while referring to FIG. 8.

(I) First, the insulating layer 10, on which the conductive circuits having the connection terminals 15 are arranged, is prepared. Then, resist 30 is formed on the insulating layer 10 and the connection terminals 15 (refer to FIG. 8A). As the resist 30, for example, photocuring photoresist can be used.

Figure 8A:
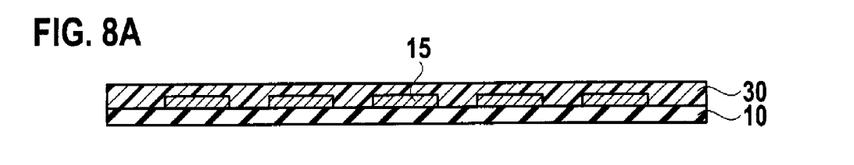
FIG. 8A to FIG. 8E are cross-sectional views of manufacturing steps, showing a method for forming the printed wiring board according to the third non-limiting embodiment.
Figure 8B:
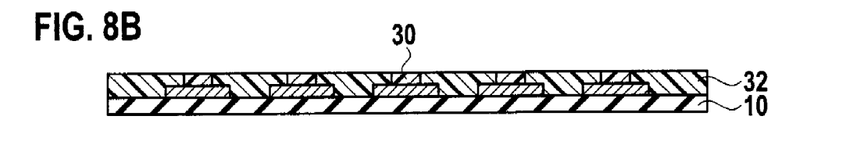
Figure 8C:
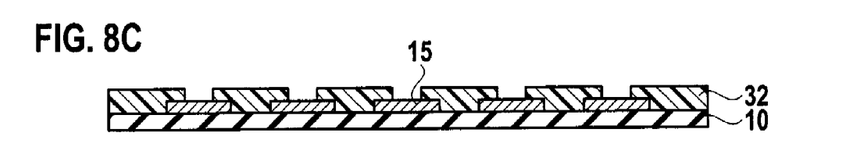

(II) Next, spots on which the projection portions 16 will not be formed are irradiated with light and exposed, whereby the resist 30 is denatured so as to cure, and is formed into cured resist 32 (refer to FIG. 8B). Then, the resist 30 that has not turned to the cured resist 32 is removed by an alkaline solution and the like (refer to FIG. 8C). In such a way, the resist 30 is patterned into a desired pattern.

Figure 8D:
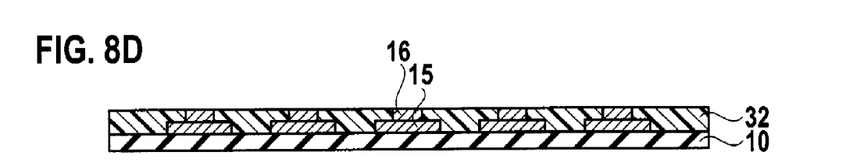

(III) Next, the plating is performed by using the cured resist 32 thus patterned, thus making it possible to form the projection portions 16 on the connection terminals 15 in the direction where the conductive circuits are extended (refer to FIG. 8D).

Figure 8E:
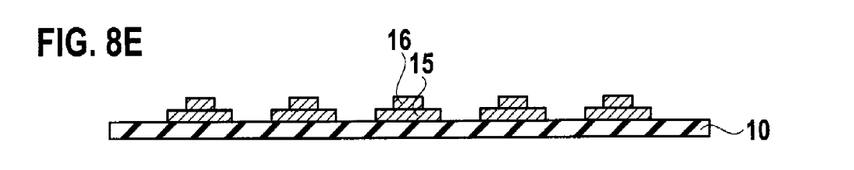

(IV) Next, the cured resist 32 thus patterned is removed (refer to FIG. 8E).

By the above-described manufacturing steps, the printed wiring board according to the third embodiment is formed.

In accordance with the method for forming a printed wiring board according to the third embodiment, the projection portions 16 are formed by the plating, thus making it possible to microfabricate the projection portions 16. Moreover, since the plating is performed by using the cured resist 32 that is patterned, it is easy to select and use a suitable plating material.

(Board Interconnection Structure)

Figure 9:
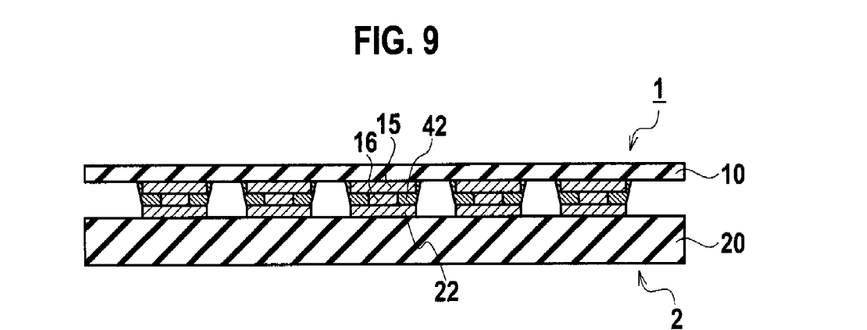
FIG. 9 is a cross-sectional view of a board interconnection structure according to the third non-limiting embodiment.

As shown in FIG. 9, the board interconnection structure according to the third embodiment of the present invention includes: the first printed wiring board 1 in which the first conductive circuits having the first connection terminals 15 on the end portions thereof are arranged on the first insulating layer 10, and the projection portions 16 are provided on the first connection terminals 15 in the direction where the first conductive circuits are extended; the second printed wiring board 2 in which second conductive circuits having second connection terminals 22 are arranged on a second insulating layer 20; and connection layers 42 which form the fillets on side surface portions of the projection portions 16 and interconnect the first connection terminals 15 and the second connection terminals 22.

As the second insulating layer 20, for example, the hard rigid board such as the glass epoxy board, the glass composite board, and the paper epoxy board can be used. Moreover, the flexible board can also be used as the second insulating layer 20. In the case of using the rigid board, for a thickness thereof, 2.4 mm, 2.0 mm, 1.6 mm. 1.2 mm, 1.0 mm, 0.8 mm, 0.6 mm, and the like can be employed. Moreover, in the case of using the flexible board, for a thickness thereof, 25 μm, 12.5 μm, 8 μm, 6 μm, and the like can be employed.

The second conductive circuits form a circuit pattern of conductors, which are designed on the second insulating layer 20. The second conductive circuits are formed by performing the pattern processing for the rolled copper foil or the electrolytic copper foil on the second insulating layer 20. For the second conductive circuits, the metal foil other than the copper foil is also usable. For a thickness of the second conductive circuits, 35 μm, 18 μm, 12 μm, 9 μm, and the like can be employed. When the second conductive circuits are formed by the subtractive method, the minimum pitch between the second conductive circuits becomes 35 μm in consideration that a width of the circuits is 15 μm at the minimum, and that a space width between the circuits is 20 μm at the minimum. Meanwhile, when the second conductive circuits are formed by the semi-additive method, the minimum pitch between the second circuits becomes 20 μm in consideration that the width of the circuits is 10 μm at the minimum, and that the space width between the circuits is 10 μm at the minimum. On the second conductive circuits, the coverlay films or the like are arranged as the cover layers (not shown). In the case of using the rigid board, the coverlay films use the solder resist as a base material, and in the case of using the flexible board, the coverlay films use, as the base material, the insulating polyimide film having the excellent flexibility even after being adhered, or the like.

A thickness of the second connection terminals 22 can be set, for example, at 15 μm and 8 μm. When the insulating layer 20 is the flexible board, the second connection terminals 22 can be arranged so as to be extended to the end portion of the second insulating layer 20. Meanwhile, when the second insulating layer 20 is the rigid board, it is preferable that the second connection terminals 22 be arranged so as to keep a little space from the end portion of the second insulating layer 20. The second connection terminals 22 are subjected to the surface treatment by the preflux treatment, the hot air leveling (HAL), the electrolytic solder plating, the electroless solder plating, and the like.

A description will be made below of a non-limiting method for forming a board interconnection structure according to the third non-limiting embodiment while referring to FIG. 10A and FIG. 10B.

Figure 10A:
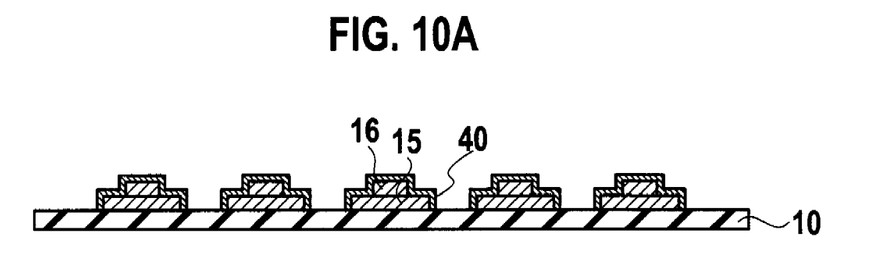
FIG. 10A and FIG. 10B are cross-sectional views of manufacturing steps, showing a connection method of the board interconnection structure according to the third non-limiting embodiment.

(I) First, solder plating 40 is formed for the first connection terminals 15 and projection portions 16 of the first printed wiring board 1 (refer to FIG. 10A).

Figure 10B:
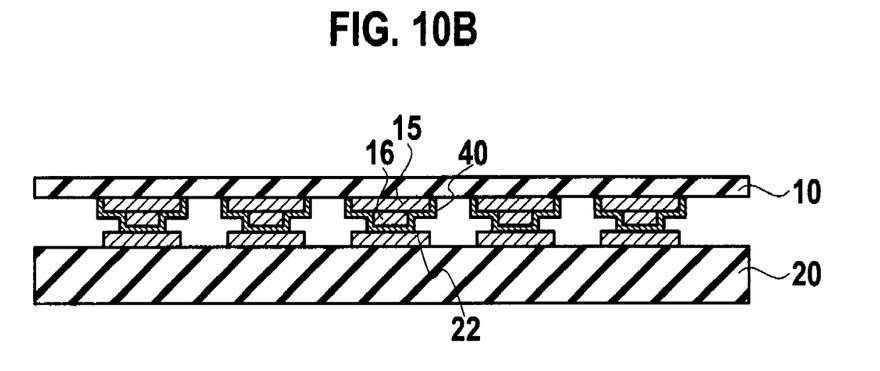

(II) Next, the first connection terminals 15 and the second connection terminals 22 are arranged so as to face each other (refer to FIG. 10B).

(III) Then, connection portions between the first connection terminals 15 and the second connection terminals 22 are heated by the heater such as the heater chip, whereby the solder plating 40 is molten, and the connection layers 42 as shown in FIG. 9 are formed. The connection layers 42 are formed, whereby the first connection terminals 15 and the second connection terminals 22 are interconnected. When the solder plating 40 is molten to form the connection layers 42, the excessive solder is stored in the side surface portions of the projection portions 16, which are gaps between the first connection terminals 15 and the second connection terminals 22, thereby forming the fillets.

By the above-described manufacturing steps, the board interconnection structure according to the third embodiment, which is shown in FIG. 9, is formed.

In accordance with the board interconnection structure according to the third embodiment, the excessive solder can be stored in the side surface portions of the projection portions 16, which are the gaps between the first connection terminals 15 and the second connection terminals 22. Accordingly, short circuit owing to the solder can be prevented. Moreover, since the fillets are formed on the side surface portions of the projection portions 16, the connection strength between the first connection terminals 15 and the second connection terminals 22 is enhanced. Specifically, with regard to each region surrounded by three surfaces, which are: the surface of the first connection terminal 15; the surface of the second connection terminal 22; and the side surface of the projection portion 16, the surface area of the region concerned is increased, whereby a contact area of the region with the solder is increased. Accordingly, the connection strength concerned can be enhanced.

Fourth Non-Limiting Embodiment

As shown in FIG. 11A to FIG. 11E, a method for forming a printed wiring board according to a fourth embodiment of the present invention is different from that of FIG. 8A to FIG. 8E, in the case of comparison therebetween, in that projection portions 16a are formed by half etching. Other features shown in FIG. 11A to FIG. 11E are substantially similar to those in the method for forming a printed wiring board, which is shown in FIG. 8A to FIG. 8E, and accordingly, a duplicate description will be omitted.

A description will be made below of the method for forming a printed wiring board according to the fourth embodiment while referring to FIG. 11A to FIG. 11E.

(I) First, the insulating layer 10, on a surface of which the conductive circuits having the connection terminals 15 are arranged, is prepared. Then, the resist 50 is coated on the insulating layer 10 and the connection terminals 15 (refer to FIG. 11A). As the resist 50, for example, the photocuring photoresist can be used.

Figure 11A:
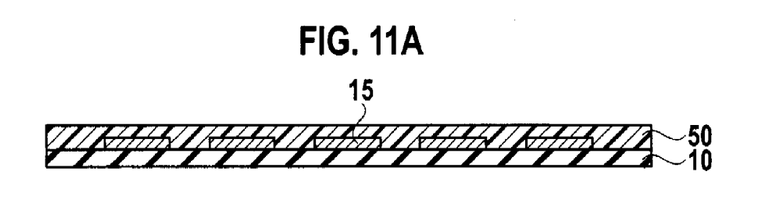
FIG. 11A to FIG. 11E are cross-sectional views of manufacturing steps, showing a method for forming a printed wiring board according to a fourth non-limiting embodiment.
Figure 11B:
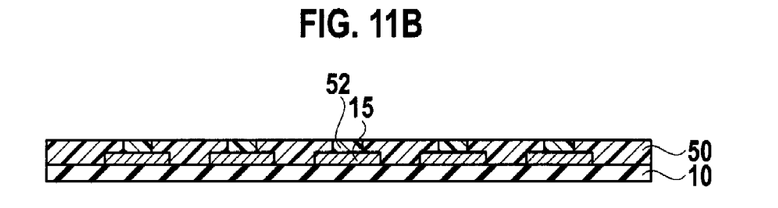
Figure 11C:
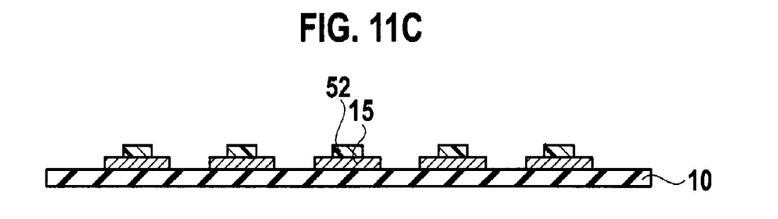

(II) Next, spots on which the projection portions 16a are formed are irradiated with light and exposed, whereby the resist 50 is denatured so as to cure, and is formed into cured resist 52 (refer to FIG. 11B). Then, the resist 50 that has not turned to the cured resist 52 is removed by an alkaline solution and the like (refer to FIG. 11C). In such a way, the resist 50 is patterned into a desired pattern.

Figure 11D:
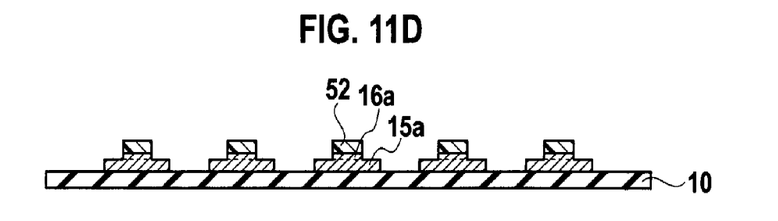

(III) Next, the half etching is performed by using the cured resist 52 thus patterned, whereby spots of the connection terminals 15, on which the cured resist 52 is not deposited, are thinned and turn to thinned connection terminals 15a (refer to FIG. 11D). Meanwhile, the spots of the connection terminals 15, on which the cured resist 52 is deposited, are not changed in thickness, and accordingly, turn to the projection portions 16a.

Figure 11E:
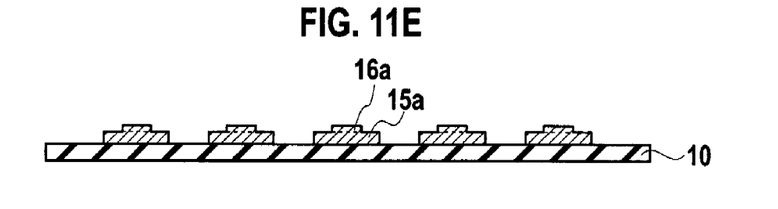

(IV) Next, the cured resist 52 thus patterned is removed (refer to FIG. 11E).

By the above-described manufacturing steps, the printed wiring board according to the fourth embodiment is formed.

In accordance with the method for forming a printed wiring board according to the fourth embodiment, the projection portions 16a are formed by the half etching, whereby heights of the thinned connection terminals 15a and the projection portions 16a can be made constant.

Fifth Non-Limiting Embodiment

Figure 12A:
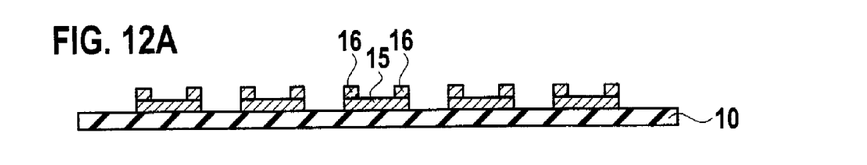
FIG. 12A is a cross-sectional view of a printed wiring board according to a fifth non-limiting embodiment.

As shown in FIG. 12A, a printed wiring board according to a fifth embodiment of the present invention is different from the printed wiring board shown in FIG. 6 in that two projection portions 16 are provided on each connection terminal 15. Moreover, as show in FIG. 12B, a board interconnection structure according to the fifth embodiment, which uses the printed wiring board shown in FIG. 12A, is different from the board interconnection structure according to the third embodiment, which is shown in FIG. 9, in that a gap 60 is provided between each pair of the projection portions 16. Other features shown in FIG. 12A and FIG. 12B are substantially similar to those in the printed wiring board shown in FIG. 7 and the method for forming a printed wiring board, which is shown in FIG. 8A to FIG. 8E, and accordingly, a duplicate description will be omitted.

Figure 12B:
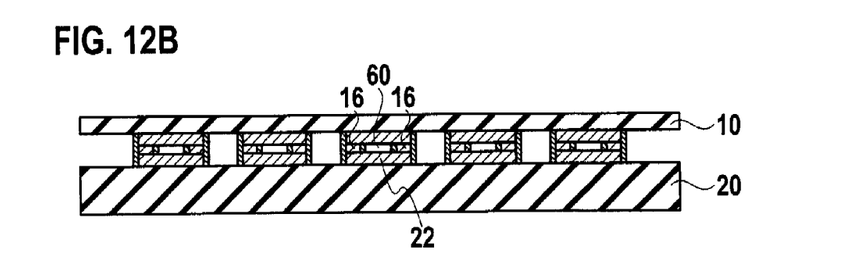
FIG. 12B is a cross-sectional view of a board interconnection structure according to the fifth non-limiting embodiment.

FIGS. 12A and 12B show that two projection portions 16 are provided on each connection terminal 15; however, the number of projection portions 16 provided on each connection terminal 15 may be a plurality that is more than two. The projection portions 16 may be formed by plating or half etching. The plurality of projection portions 16 may be formed of materials different from one another.

In accordance with the board interconnection structure using the printed wiring boards according to the fifth embodiment, the gaps 60 are provided, thus making it possible to store the excessive solder in the gaps 60. Hence, the short circuit owing to the solder can be prevented. Moreover, the fillets are formed by using the gaps 60, thus making it possible to enhance the connection strength between the first insulating layer 10 and the second insulating layer 20. Specifically, a surface area of each gap 60 surrounded by four surfaces, which are: the surface of the first connection terminal 15; the surface of the second connection terminal 22, and two side surfaces of the projection portions 16, is increased, thus making it possible to enhance the connection strength.

Other Non-Limiting Embodiments

The description has been made as above of the present invention based on the non-limiting embodiments. However, it should be understood that the description and the drawings, which form a part of this disclosure, do not limit the present invention. From this disclosure, various alternative embodiments and application technologies should be made obvious for those skilled in the art.

For example, in the first and second non-limiting embodiments, each of the cross sections of the first connection terminals 11a and the second connection terminals 13b forms the trapezoidal shape in which the side surfaces are linear; however, the side surfaces may be bent in the arc shape. If the side surfaces are bent in the arc shape, whereby the surface areas of the side surfaces of the first connection terminals 11a and the second connection terminals 13b are increased, then the connection areas of these connection terminals to the solder are increased, thus making it possible to enhance the connection strength therebetween.

Moreover, in the third and fourth non-limiting embodiments, the projection portions 16 are formed only on the first printed wiring board 1; however, the projection portions 16 may be provided on the second printed wiring board 2. In this case, the projection portions 16 of the first printed wiring board 1 and the projection portions 16 of the second wiring board 2 are alternately arranged so as not to contact each other, whereby the surface areas of the surfaces of the first connection terminals 15, the surfaces of the second connection terminals 22, and the side surfaces of the projection portions 16 are increased. Hence, in a similar way to the above description, the connection strength can be enhanced.

Figure 13:
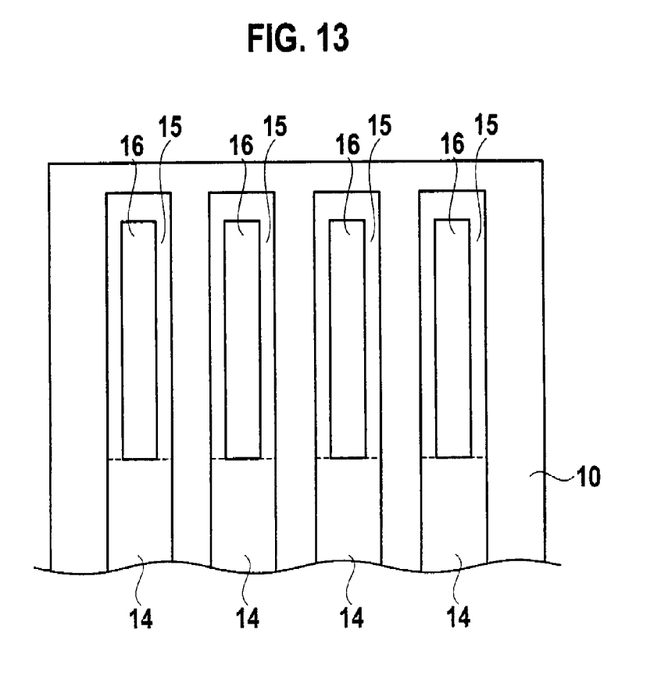
FIG. 13 is a plan view of a printed wiring board according to other non-limiting embodiments.

Furthermore, the description has been made such that each projection portion 16 in the third embodiment is formed across the entire width of the connection terminal 15 in the direction where the conductive circuit 14 is extended as show in FIG. 6; however, as shown in FIG. 13, each projection portion 16 may be formed to be shorter than the entire width of the connection terminal 15 in the direction where the conductive circuit 14 is extended. Each projection portion 16 is formed to be shorter than the entire width of the connection terminal 15 in the direction where the conductive circuit 14 is extended, whereby the short circuit can be prevented by forming the fillet on an end surface of each projection portion 16 even if the molten solder flows in the direction where the conductive circuit 14 is extended. Moreover, the fillet is formed on the end surface of each projection portion 16, thus also making it possible to enhance the connection strength between the connection terminal 15 and the insulating layer 10.

As described above, it should be understood that the present invention incorporates various embodiments and the like, which are not described herein. Hence, the present invention is limited only by items which specify the invention in the scope of claims reasonable from this disclosure.

What is claimed is:

1. A board interconnection structure, comprising:
   a first printed wiring board in which a first conductive circuit is arranged on a first insulating layer, the first conductive circuit including, on an end portion thereof, a first connection terminal having an upper surface width that is narrower than a bottom surface width thereof;
   a second printed wiring board in which a second conductive circuit including a second connection terminal is arranged on a second insulating layer; and
   a connection layer that forms fillets along longitudinal side surfaces of the first connection terminal, and interconnects the first connection terminal and the second connection terminal,
   wherein the fillets have concave side surfaces,
   wherein the first connection terminal extends along the first insulating layer in a longitudinal direction, and
   wherein the longitudinal side surfaces connect the bottom surface of the first connection terminal to the upper surface.

2. The board interconnection structure according to claim 1,
   wherein an upper surface width of the second connection terminal is narrower than a bottom surface width thereof.

3. The board interconnection structure according to claim 1,
   wherein the first connection terminal and the second connection terminal formed by a subtractive method.

4. The board interconnection structure according to claim 1,
   wherein the bottom surface width of the first connection terminal is substantially equal to a width of the second connection terminal.

5. The board interconnection structure according to claim 1,
   wherein an underfill material is provided at a periphery of the connection layer.

6. The board interconnection structure according to claim 1,
   wherein the first connection terminal has a projection portion formed thereon, the projection portion extending in a direction in which the first conductive circuit is extended.

7. The board interconnection structure according to claim 6,
   wherein the second connection terminal has a projection portion formed thereon, the projection portion extending in a direction in which the second conductive circuit is extended.

8. The board interconnection structure according to claim 1, wherein a gap is formed between the first and second conductive circuits,
   wherein excess solder of the connection layer is stored in the gap.

9. The board interconnection structure according to claim 1, wherein the connection layer consists of only one substance that has a common melting temperature throughout.

* * * * *